United States Patent
Leip

(10) Patent No.: US 6,452,436 B1
(45) Date of Patent: Sep. 17, 2002

(54) APPARATUS AND METHOD FOR MANAGING AUTOMATIC TRANSITIONS BETWEEN MULTIPLE FEEDBACK PATHS

(75) Inventor: David G. Leip, Newtonville, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/833,985

(22) Filed: Apr. 12, 2001

(51) Int. Cl.[7] .............................................. H03K 17/13

(52) U.S. Cl. ......................... 327/407; 327/59; 327/78; 327/590

(58) Field of Search ................................. 327/403, 407, 327/408, 590, 78, 79, 58, 59, 62, 99

(56) References Cited

U.S. PATENT DOCUMENTS 5,430,400 A * 7/1995 Herlein et al. ............... 327/407
6,040,718 A * 3/2000 Henry ......................... 327/407

OTHER PUBLICATIONS

Octal V/I (OV/I) Dual Power Amplifier Sub–Project Proposal, LA698, David Leip, Sep. 28, 1998, pp. 1,4 and 8–14.
Schematic, pp. 1–2 of 5, of the Teradyne CT317 DC Measurement System, created Oct. 16, 1979.

* cited by examiner

*Primary Examiner*—Timothy P. Callahan
*Assistant Examiner*—Terry L. Englund
(74) *Attorney, Agent, or Firm*—Bruce D. Rubenstein

(57) ABSTRACT

An improved crossover circuit for a V/I source includes a selector and a measurement circuit. The selector and measurement circuit both receive error signals indicative of differences between programmed and actual values of output voltage and current of the V/I source. In response to occurrences of predetermined events among the error signals, the measurement circuit activates the selector to pass one of the error signals to a control circuit for establishing a feedback loop. Different events cause different error signals to be selected, and hence cause different feedback loops of the V/I source to be activated. The improved crossover circuit provides increased control over the selection of feedback mode, and enhances the ability to individually optimize dynamic behavior of different feedback modes.

26 Claims, 7 Drawing Sheets

APPARATUS AND METHOD FOR MANAGING AUTOMATIC TRANSITIONS BETWEEN MULTIPLE FEEDBACK PATHS

FIELD OF THE INVENTION

This invention relates generally to automatic test equipment (ATE) for electronics, and, more particularly, to electronic sources that automatically switch between voltage control and current control depending upon programming and load conditions.

BACKGROUND OF THE INVENTION

ATE systems commonly include a variety of electronic sources for setting bias conditions and testing DC characteristics of devices. A type of electronic source known as a "V/I" source combines both voltage-forcing and current-forcing modes in a single instrument. The two modes generally share a common control circuit and output stage, but employ different feedback paths. The different feedback paths can be engaged programmatically, for example by explicitly setting a force-voltage or force-current mode, or can be engaged automatically, as described below.

Automatically controlled V/I sources accept programmed values for voltage and current, and switch between voltage-controlled and current-controlled modes automatically, as required, to ensure that neither the programmed voltage nor the programmed current is exceeded. For example, an automatically controlled V/I source programmed for 5 Volts and 5 mA would operate in voltage-controlled mode (at 5 Volts) when connected to grounded loads greater than 1 KΩ, but would automatically switch to current-controlled mode (at 5 mA) when driving grounded loads less than 1 KΩ.

V/I sources often include greater than two control modes. One type of V/I source provides one current-controlled mode and two voltage-controlled modes. This type of source functions as a current source with positive and negative voltage clamps. Another type of V/I source provides one voltage-controlled mode and two current-controlled modes. This type of source functions as a voltage source with positive and negative current limits. Some V/I sources include four feedback modes—two current-controlled modes and two voltage-controlled modes. Only three modes are allowed to be active at a time. The source can be used as either a current source with two clamps or a voltage source with two current limits, depending upon how the source is programmed.

FIG. 1 is a simplified illustration of a conventional V/I source 100. The source 100 is configured as a voltage source with two current limits. A digital-to-analog converter (DAC) 110 establishes a desired output voltage for the V/I source 100. A summing circuit 116 subtracts a voltage feedback signal from an output voltage of the DAC 110, to produce an error voltage, $V_{ERROR}$. A crossover circuit 122 selects one feedback path for passage to a control circuit 124. When the V/I source 100 is operating in voltage-controlled mode, the crossover circuit 122 passes the $V_{ERROR}$ to the control circuit 124. The output of the control circuit 124 is fed to a gain stage 126 and to a shunt 128 before arriving at a device under test (DUT) 132. When operating in voltage-controlled mode, the V/I source 100 forms a closed loop feedback system among the elements described above, and maintains an output voltage at the DUT 132 at the value prescribed by the DAC 110.

The V/I source 100 also includes DACs 112 and 114 for establishing positive and negative current limits, respectively. A differential circuit 130 coupled to the shunt 128 produces a current feedback signal proportional to the voltage across the shunt. Summers 118 and 120 subtract the current feedback signal from the outputs of DACs 112 and 114, to develop error signals $I_{PosError}$ and $I_{NegError}$, respectively. When the V/I source 100 operates in positive current-controlled mode, the crossover circuit 122 passes $I_{PosError}$ to the control circuit 124; when it operates in negative current-controlled mode, the crossover circuit 122 passes $I_{NegError}$. The circuit elements combine to form feedback systems that maintain the output current of the V/I source 100 at the value prescribed by DAC 112 or DAC 114, depending upon which of the two current modes is operative.

The control circuit 124 typically includes an integrating circuit for establishing dominant frequency characteristics of the V/I source. The gain stage 126 may provide voltage gain, current gain, or both. The shunt 128 generally includes an array of different resistors that can be individually selected to accommodate different current ranges.

FIG. 2 illustrates a conventional crossover circuit 122 commonly used with the V/I source 100 of FIG. 1. The crossover circuit 122 includes operational amplifiers (op amps) 214 and 224, buffers 212 and 222, diodes 216, 218, 226, and 228, and resistors 210, 220, and 230. The op amps 214 and 224 each have two distinct states of operation—an active state and an inactive state.

Taking the op amp 214 as an example, the op amp 214 assumes the active state whenever $I_{PosError}$ is less than $V_{ERROR}$. Under these conditions, diode 216 becomes reverse-biased and diode 218 conducts in the forward direction. A feedback loop is formed consisting of op amp 214, diode 218, buffer 222, and resistor 220. The feedback loop tends to drive the input of the buffer 212 to a level equal to $I_{PosError}$. The buffer 212 then provides $I_{PosError}$ to the input of the control circuit 124.

Op amp 214 assumes the inactive state whenever $I_{PosError}$ is greater than $V_{ERROR}$. Diode 218 becomes reverse-biased and diode 216 conducts. $I_{PosError}$ is thus cut off from the control circuit 124, and feedback is closed locally around op amp 214 via diode 216.

The negative polarity operates in an analogous manner. Op amp 224 assumes the active state whenever $I_{NegError}$ is greater than $V_{ERROR}$. A feedback loop is formed consisting of op amp 224, diode 228, buffer 222, and resistor 230. The loop tends to drive the input of the buffer 212 to $I_{NegError}$, and establishes the negative current-controlled mode. When $I_{NegError}$ is less than $V_{ERROR}$, diode 228 becomes reverse-biased and diode 226 conducts, thus cutting off $I_{NegError}$ from the control circuit 124 and locally closing feedback around the op amp 224.

The crossover circuit 122 thus engages a current-controlled mode when either of the op amps 214 and 224 operates in its active state. When both op amps operate in their inactive states, the crossover circuit 122 engages voltage-controlled mode. Voltage-controlled mode is thus engaged whenever $V_{ERROR}$ is greater than $I_{NegError}$ and less than $I_{PosError}$. In voltage-controlled mode, the crossover circuit 122 passes $V_{ERROR}$ to the control circuit 124 via resistor 210.

The crossover circuit 122 generally operates smoothly and accurately, making virtually seamless transitions between feedback modes. We have recognized, however, that the crossover circuit 122 can behave improperly during programming and output transients. For example, when programming a fast voltage step (via the DAC 110), the signal $V_{ERROR}$ undergoes a voltage step from its steady-state value. The resulting step can momentarily cause $V_{ERROR}$ to cross $I_{PosError}$ or $I_{NegError}$. These conditions cause the V/I source to inappropriately switch from voltage-controlled mode to one of its current-controlled modes. The mode change is "inappropriate" because it is not caused by excessive current flow; in fact, the output current may be zero. Rather, it is the natural consequence of applying a fast programming step.

FIG. 3 illustrates this condition. FIG. 3 is a V/I plot of the V/I source 100 operating with the crossover circuit of FIG. 2. The curve 300 represents the output of the V/I source during its three distinct feedback modes:

1. The upper, horizontal portion of the curve 300 represents the output of the V/I source when the positive current loop is engaged and programmed to a value $I_{ProgPos}$;
2. The vertical portion represents the output when the voltage loop is engaged and programmed to a value $V_{Prog}$; and
3. The lower, horizontal portion represents the output when the negative current loop is engaged and programmed to a value $I_{ProgNeg}$.

As long as the V/I source 100 operates in a settled state, the output of the V/I source will fall somewhere along the V/I curve 300. This is not the case, however, during programming and output transients. As indicated above, the V/I source 100 assumes positive current-controlled mode whenever $I_{ProgPos} > V_{ERROR}$ and negative current-controlled mode whenever $I_{ProgNeg} < V_{ERROR}$. The shaded regions depicted in the left and right portions of FIG. 3 respectively illustrate these areas. During transients, the V/I source can momentarily operate in the shaded regions, inappropriately engaging the current limits even though the output current is within limits. The V/I source can also fail to engage its current limits, even though the programmed currents are exceeded.

Inappropriately switching to current-controlled mode dramatically slows the settling time of the V/I source. Once the V/I source changes to a current-controlled mode, it remains in that mode until the error signal of the active current-control loop and $V_{ERROR}$ again cross. Depending upon the values of $I_{ProgPos}$ and $I_{ProgNeg}$, hundreds of microseconds may pass before the V/I source restores itself to voltage-controlled mode. This interval is exceedingly long compared with the normal settling time of the V/I source, i.e., when the current loops do not engage. In an automatic testing environment, delays in programming a V/I source translate directly to reduced testing throughput. A reduction in throughput detrimentally impacts testing efficiency.

What is needed is a crossover circuit for a V/I source that does not inappropriately switch feedback modes and consequently cause programming delays.

SUMMARY OF THE INVENTION

With the foregoing background in mind, it is an object of the invention to prevent an electronic source from assuming improper feedback modes during programming and output transitions.

To achieve the foregoing object, as well as other objectives and advantages, an improved crossover circuit is provided for use with an electronic source having a control circuit and providing at least one voltage-controlled mode and at least one current-controlled mode. The crossover circuit includes a selector and a measurement circuit. The selector and measurement circuits both receive a plurality of signals indicative of feedback voltage and feedback current of the electronic source. The measurement circuit monitors the plurality of signals and generates, in response to occurrences of predetermined events on the plurality of signals, at least one control signal. The selector operates in response to the at least one control signal, to select one of the plurality of signals for passage to the control circuit. A feedback loop is then formed for the electronic source employing the selected signal.

BRIEF DESCRIPTION OF THE DRAWINGS

Additional objects, advantages, and novel features of the invention will become apparent from a consideration of the ensuing description and drawings, in which.

DETAILED DESCRIPTION OF THE PREFERRED EMBODIMENT

Topology and Operation

Figure 1:
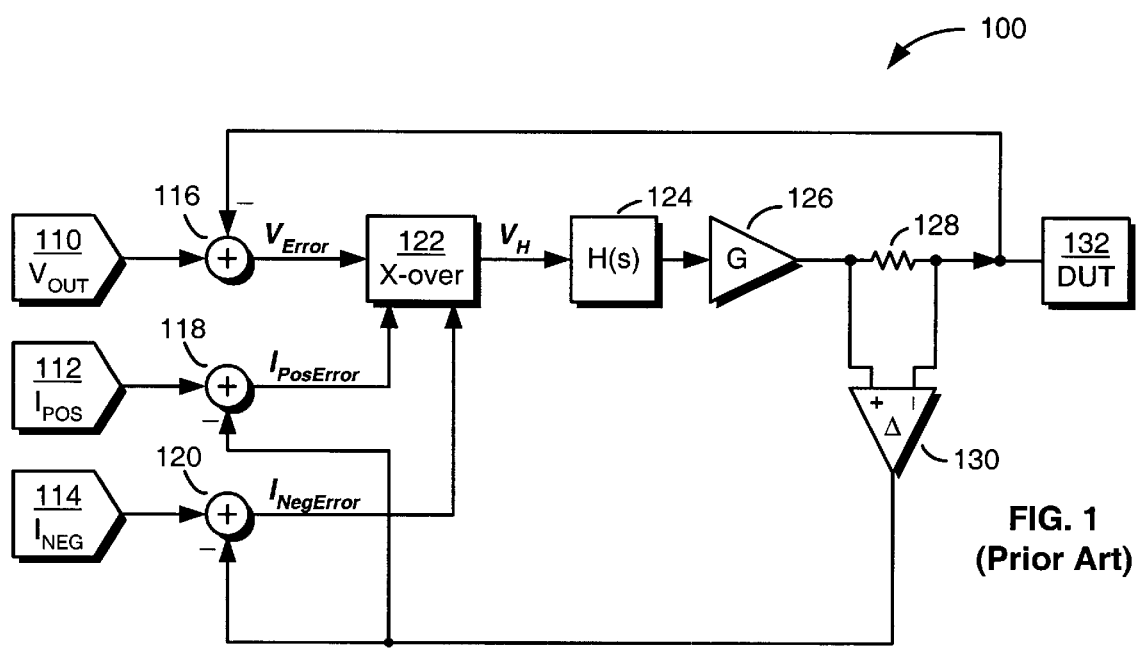
FIG. 1 is a block diagram of a conventional electronic source that provides operation in one voltage-controlled mode and two current-controlled modes.
Figure 2:
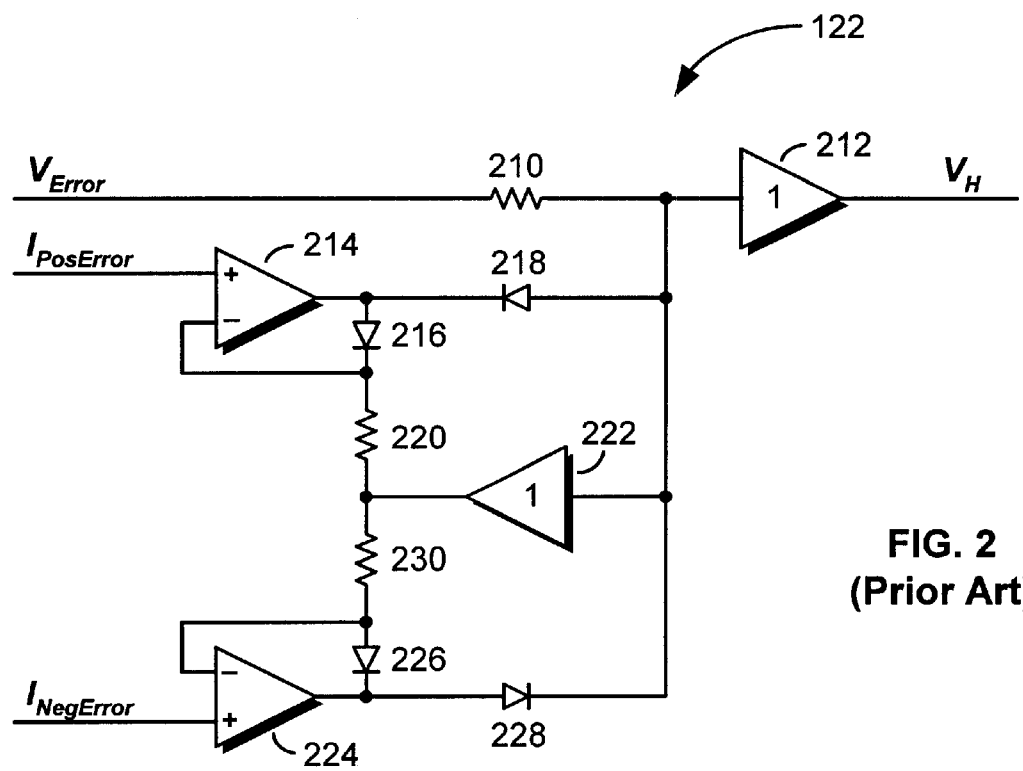
FIG. 2 is a simplified schematic of a conventional crossover circuit used in the electronic source of FIG. 1, which automatically makes transitions between the voltage-controlled mode and the two current-controlled modes.
Figure 4:
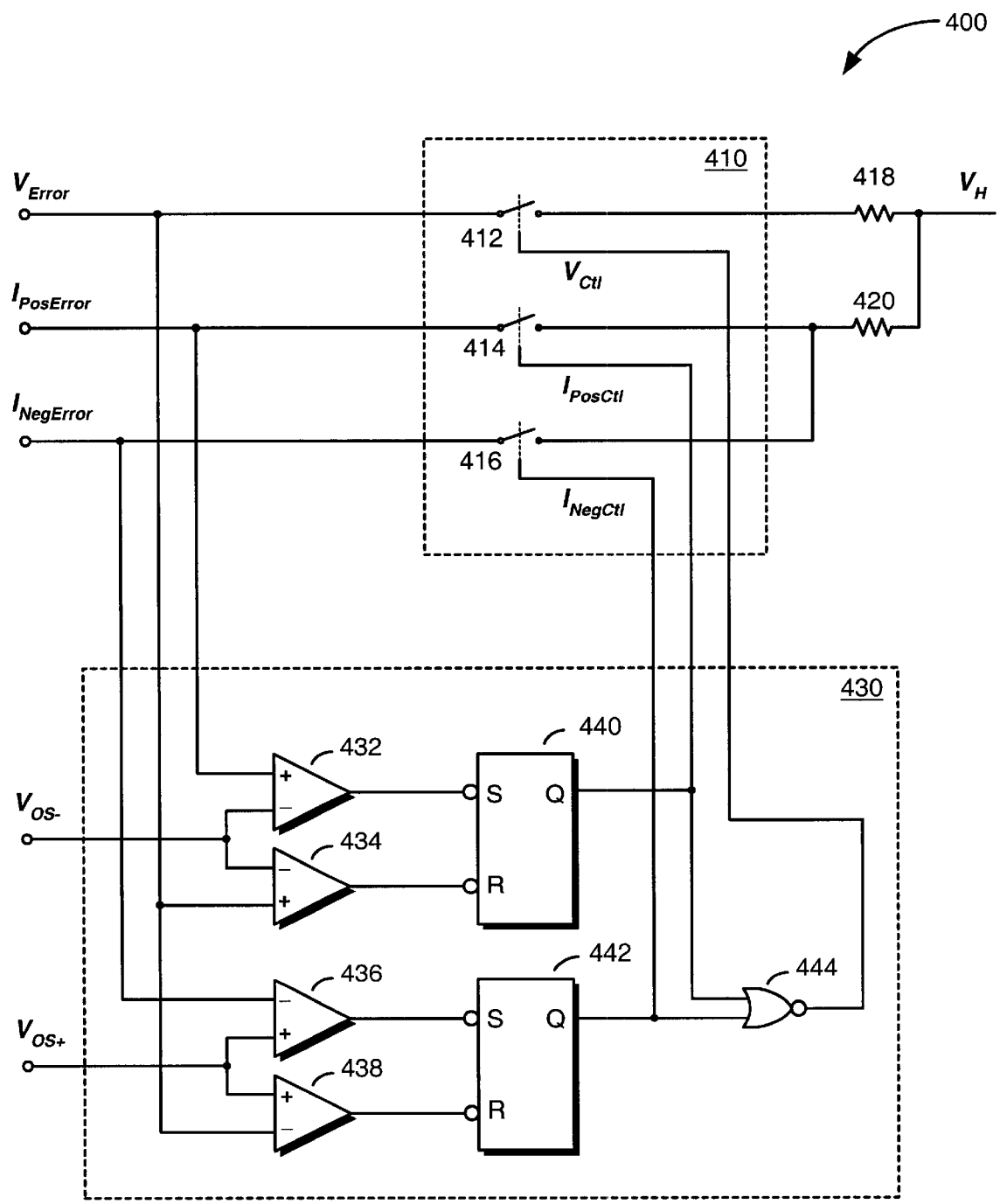
FIG. 4 is a simplified schematic of a crossover circuit constructed in accordance with the invention.

FIG. 4 shows an illustrative embodiment of a crossover circuit 400 in accordance with the invention. The crossover circuit 400 can be used in place of the crossover circuit 122 of FIG. 2. As shown in FIG. 4, the crossover circuit 400 includes a selecting circuit 410 and a measurement circuit 430. The selecting circuit 410 and measurement circuit 430 both have inputs that receive the error signals $V_{ERROR}$, $I_{PosError}$, and $I_{NegError}$. In response to occurrences of predetermined events among the error signals, the measurement circuit activates the selecting circuit 410 to pass one of the error signals to the control circuit 124.

The measurement circuit 430 includes first and second comparators 432 and 434. The outputs of the first and second comparators 432 and 434 are respectively coupled to SET and RESET inputs of a first latching circuit 440. The first comparator 432 has a non-inverting input that receives $I_{PosError}$. The second comparator 434 has a non-inverting input that receives $V_{ERROR}$. The first and second comparators 432 and 434 each have an inverting input that receives a first reference voltage, $V_{OS-}$. In the preferred embodiment, $V_{OS-}$ is set to a small negative value, such as −7 mV.

The first latching circuit 440 "sets" when $I_{PosError}$ drops below $V_{OS-}$ and "resets" when $V_{ERROR}$ drops below $V_{OS-}$. In response to a "set" state of the first latching circuit 440, the measurement circuit 430 asserts a control signal $I_{PosCtl}$, which activates the selecting circuit 410 to pass $I_{PosError}$ to the control circuit 124. A feedback loop is then established wherein the output current of the V/I source 100 tends to match the value prescribed by the DAC 112. In response to a "reset" state of the latching circuit 440, the control signal $I_{PosCtl}$ is de-asserted, and $I_{PosError}$ is isolated from the control circuit 124. $I_{PosError}$ then has no affect on the output of the V/I source.

The measurement circuit 430 also includes third and fourth comparators 436 and 438. These comparators have outputs that are respectively coupled to SET and RESET inputs of a second latching circuit 442. The third comparator 436 has an inverting input that receives $I_{NegError}$. The fourth comparator 438 has an inverting input that receives $V_{ERROR}$. The third and fourth comparators 436 and 438 each have a non-inverting input that receives a second reference voltage, $V_{OS+}$. In the preferred embodiment, $V_{OS+}$ is set to a small positive value, such as +7 mV.

The third latching circuit 442 "sets" when $I_{NegError}$ exceeds $V_{OS+}$, and "resets" when $V_{ERROR}$ exceeds $V_{OS+}$. When the latching circuit 442 is "set," the measurement circuit 430 asserts a control signal $I_{NegCtl}$, which causes the selecting circuit 410 to pass $I_{NegError}$ to the control circuit 124. When the latch 442 is "reset," the measurement circuit 430 de-asserts $I_{NegCtl}$ and consequently blocks $I_{NegError}$ from the control circuit 124.

With the first and second latching circuits 440 and 442 both "reset," the measurement circuit 430 asserts a control signal $V_{Ctl}$. Assertion of $V_{Ctl}$, via a NOR gate 444, activates the selecting circuit 410 to pass $V_{ERROR}$ to the control circuit 124. When $V_{ERROR}$ is selected, the V/I source 100 tends to drive its output voltage to the value prescribed by the DAC 110.

With the arrangement described above, one error signal is always selected, and only one error signal is ever selected at a time. $I_{PosError}$ and $I_{NegError}$ are never selected at the same time. The positive current DAC 112 should always produce a more positive output than the negative current DAC 114 (this rule is preferably enforced by design). Therefore, $I_{PosError}$ should always be more positive than $I_{NegError}$. Because $I_{PosError}$ is selected only when it goes negative and $I_{NegError}$ is selected only when it goes positive, the voltage difference between $I_{PosError}$ and $I_{NegError}$ ensures that conditions are never met to select both at the same time. In addition, owing to the operation of the NOR gate 444, $V_{ERROR}$ is selected only when neither current error is selected. Thus, there can never be an instance in which the V/I source operates with multiple feedback paths active, or when it operates "open loop."

Figure 5A:
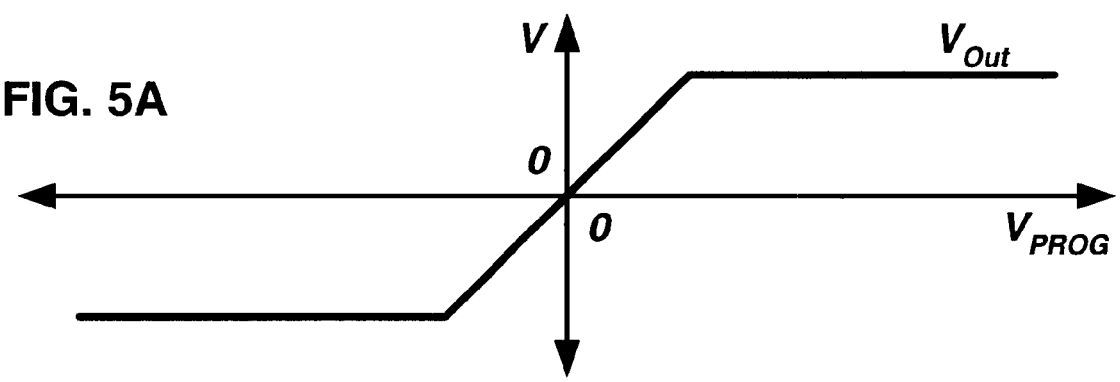
FIGS. 5A–5C are curves that illustrate the output voltage and feedback error signals of an electronic source of FIG. 1 as a function of programmed voltage, driving a resistive load with the electronic source equipped with the crossover circuit of FIG. 4.
Figure 5B:
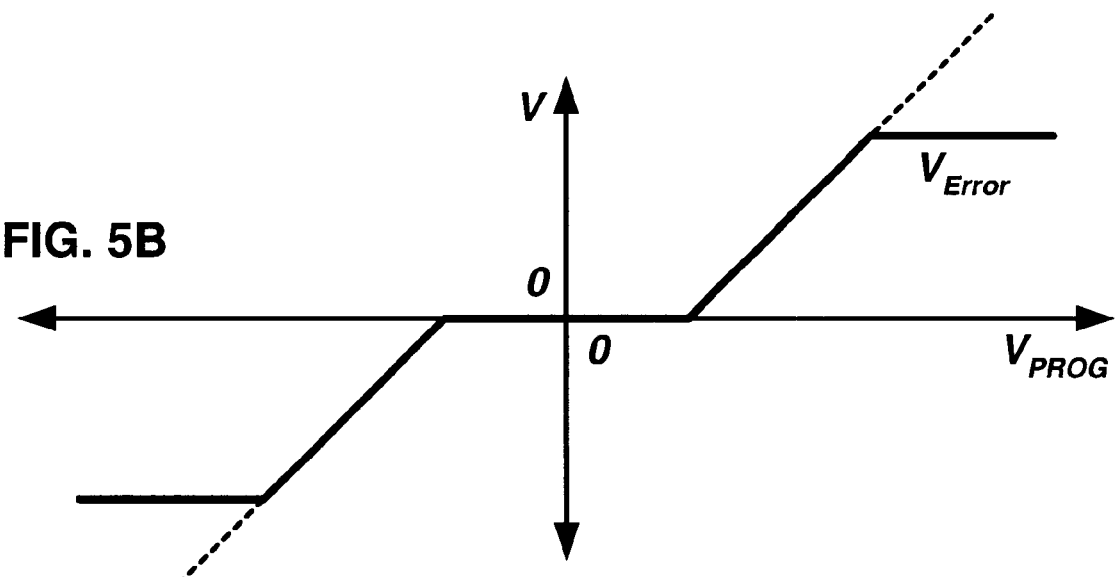
Figure 5C:
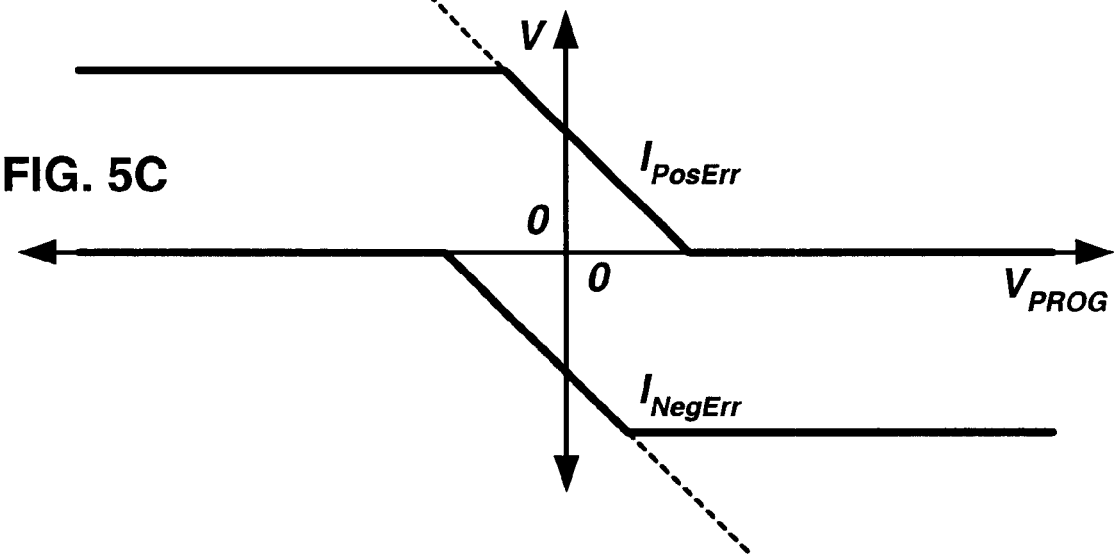

FIGS. 5A–C illustrate the behavior of the crossover circuit 400 as functions of programmed voltage, i.e. as functions of the output of the DAC 110, with the V/I source driving a resistive load. As shown in FIG. 5A, the output voltage $V_{Out}$ of the V/I source varies directly with programmed voltage, unless the V/I source is operating in positive or negative current limit. In current limit, output voltage remains constant, regardless of changes in programmed voltage.

As shown in FIG. 5B, $V_{ERROR}$ remains at 0 Volts when the V/I source operates in voltage-controlled mode, because voltage feedback ensures that $V_{Out}=V_{PROG}$. When the V/I source enters current limit, however, $V_{ERROR}$ deviates from 0 Volts, because $V_{PROG}$ continues to change while $V_{Out}$ remains constant. Eventually, $V_{ERROR}$ levels off at a voltage determined by the output limits of the summer circuit 116.

As shown in FIG. 5C, $I_{PosError}$ operates at 0 Volts when the V/I source operates in positive current limit, because the output current of the V/I source equals the positive current limit from the DAC 112. $I_{PosError}$ is positive, however, when the V/I source operates in voltage-controlled, or negative current-controlled, mode. Analogously, $I_{NegError}$ is maintained at 0 Volts when the V/I source operates in negative current limit, but is negative at all other times. Both $I_{PosError}$ and $I_{NegError}$ eventually level off as the summers 118 and 120 that produce them reach the limits of their respective output circuits.

A significant aspect of the crossover circuit 400 is that it compares error signals $V_{ERROR}$, $I_{PosError}$ and $I_{NegError}$ with zero or near-zero voltages rather than with each other. The instant invention exploits this fact by responding to the zero-crossing, or near zero-crossing, of the error signals.

As the zero-crossings of the error signals indicate a need to change modes, the crossover circuit 400 could be configured with threshold voltages $V_{OS+}$ and $V_{OS-}$ both set to 0 Volts. We have discovered, however, that setting the thresholds to 0 Volts can cause the crossover circuit 400 to undesirably oscillate between modes. Providing small offsets effectively adds hysteresis to the crossover circuit 400, and helps to ensure that noise signals do not cause the circuit to oscillate.

To illustrate the effect of hysterisis, consider a small negative offset voltage $V_{OS-}$ on the comparators 432 and 434. This offset voltage forces $I_{PosError}$ to go slightly negative before the crossover circuit 400 switches to positive current control. Typically, this means that $V_{Out}$ will attain a slightly greater value just before current limiting than just after. When the current limit engages, $V_{Out}$ is pulled negative, causing $V_{ERROR}$ to be pushed positive. The sudden upward movement of $V_{ERROR}$ tends to push it out of the noise range of the crossover circuit and tends to prevent the V/I source from inappropriately re-entering voltage-controlled mode. By an analogous process, a small positive voltage $V_{OS+}$ on the comparators 436 and 438 tends to prevent oscillations when switching into negative current limit. The offset voltages also inhibit oscillations when switching to voltage-controlled mode from either of the current-controlled modes.

As shown in FIGS. 5B–C, $V_{ERROR}$ normally increases as the V/I source enters positive current limit and normally decreases as the V/I source enters negative current limit. These movements of $V_{ERROR}$ generally ensure that the SET and RESET inputs of each of the latches 440 and 442 are not active at the same time. In rare instances, however, it is possible for both inputs to be active simultaneously. Under these conditions, the properties of the latches 440 and 442 determine the mode (SET or RESET) that dominates. Commercially available S/R latches generally specify which mode dominates in the event that both inputs are active at one time. For S-R latches constructed from cross-coupled NAND gates, the SET input dominates. Regardless of the type of S-R latch used, it is recommended that the crossover circuit be arranged so that the current limiting mode dominates under these conditions, to ensure that current limits are strictly enforced.

Figure 3:
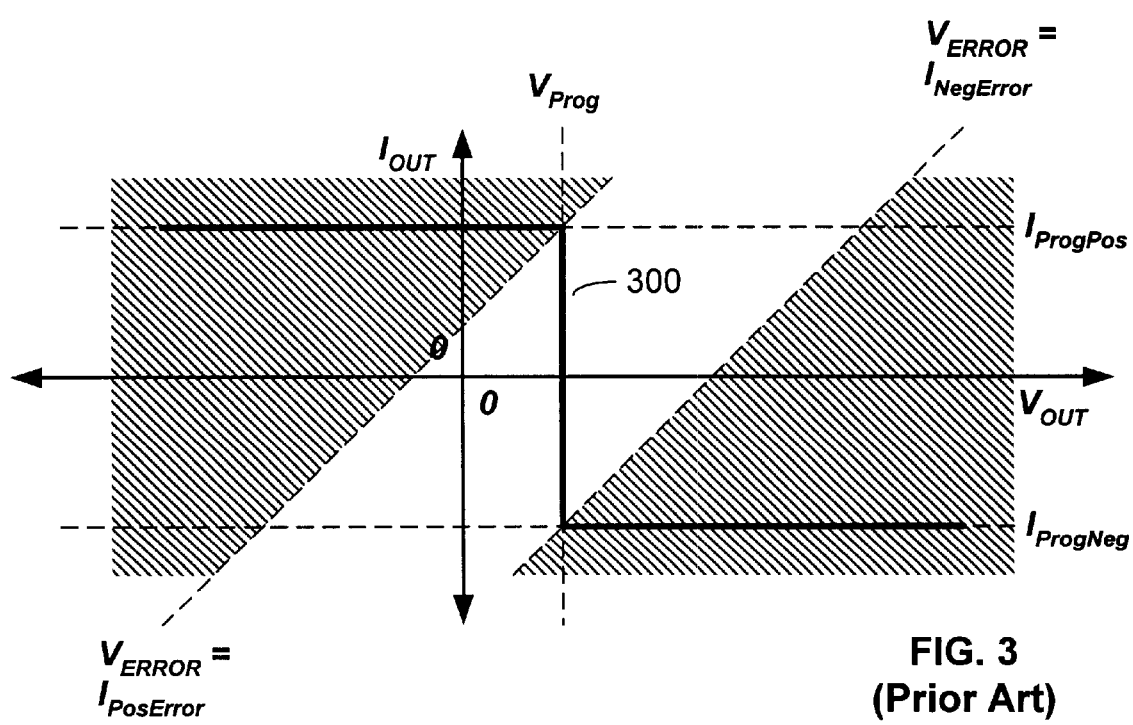
FIG. 3 is a current vs. voltage graph of the electronic source of FIG. 1 using the crossover circuit of FIG. 2, depicting areas in which current limits may be active.
Figure 6:
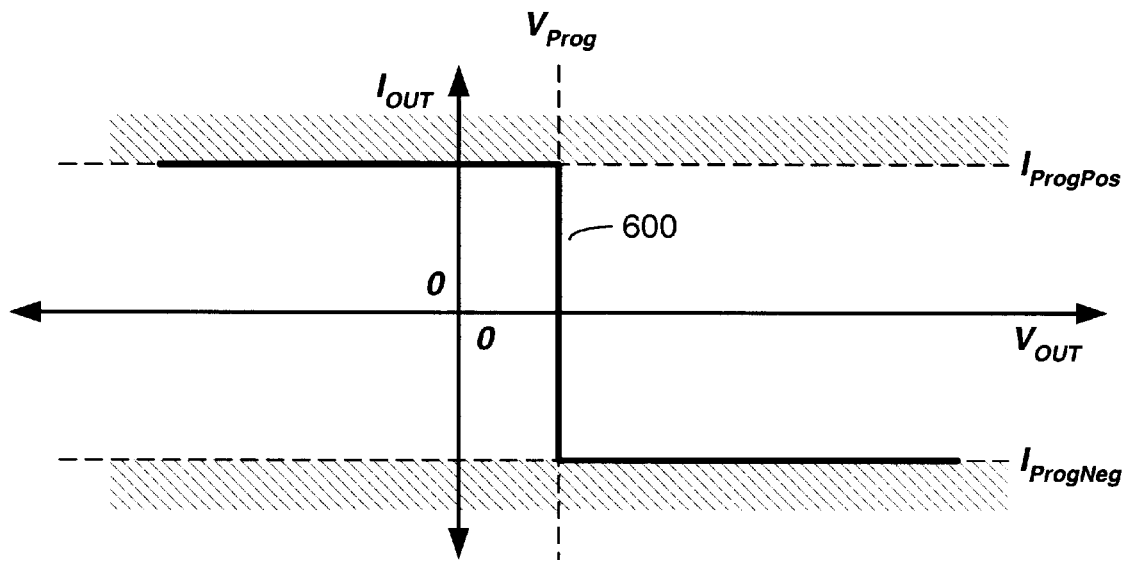
FIG. 6 is a current vs. voltage graph of the electronic source of FIG. 1 using the improved crossover circuit of FIG. 4, depicting areas in which current limits of the improved circuit may be active.

The crossover circuit 400 represents a significant advance over the prior circuit 122. FIG. 6 is a V/I plot of the V/I source 100 operating with the crossover circuit 400. The curve 600 represents the output of the V/I source during its three feedback modes. The shaded portions represent areas in which the current limits are engaged. In contrast with the V/I plot of FIG. 3, the V/I plot of FIG. 6 includes no areas in which the current limits are engaged when they should not be engaged. In addition, it includes no areas in which the current limits are not engaged when they should be engaged. Therefore, the crossover circuit 400 enables the V/I source 100 to always assume the appropriate feedback mode, even under transient conditions. The V/I source 100 can thus avoid the long programming delays incurred using the prior crossover circuit, and testing throughput is significantly increased.

Figure 7:
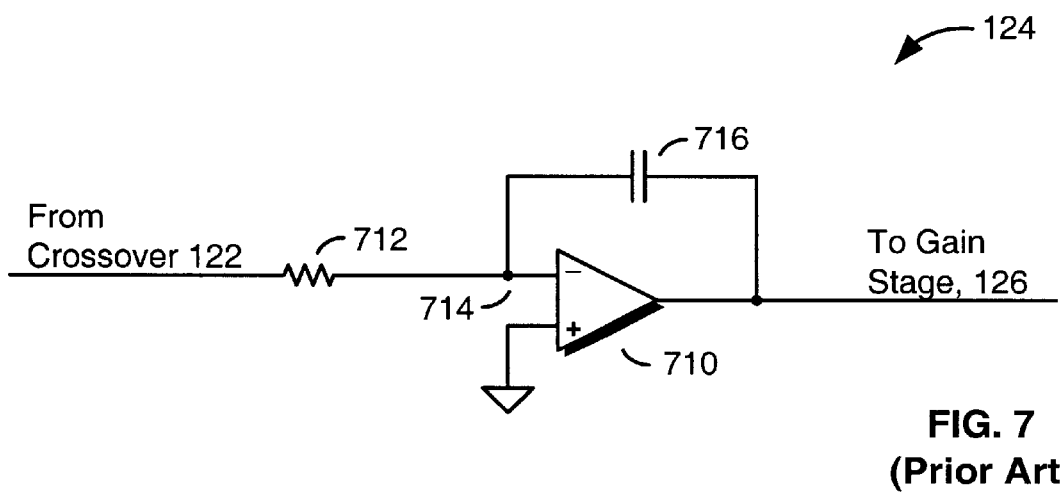
FIG. 7 is a simplified schematic of a conventional integrator circuit, which could be used in connection with the control circuit of FIG. 1.

We have discovered an additional and unintended benefit of the crossover circuit 400—it readily allows the voltage and control loops to be individually stabilized. FIG. 7 shows a highly simplified schematic of the control circuit 124, which includes a conventional integrator. The integrator consists of a operational amplifier 710 having its non-inverting input grounded, and its inverting input 714 receiving a selected error signal (one of $V_{ERROR}$, $I_{PosError}$ and $I_{NegError}$) via an input resistor 712. A capacitor 716 connected between the inverting input 714 and the output of the operational amplifier operates in conjunction with the input resistor 712 to establish dominant frequency characteristics of the V/I source 100.

When using the prior crossover circuit 122, the same input resistor 712 of the control circuit 124 is used for voltage-controlled mode and both current-controlled modes of the V/I source. This means that all three modes use the same components for establishing their dominant frequency characteristics. As known to those skilled in the art, however, voltage-controlled modes and current-controlled modes generally have different frequency response characteristics.

When using the same integrator components, the open loop gain of the current-controlled loops generally exceeds the open loop gain of the voltage-controlled loop. This is attributable to the need to provide a small full-scale voltage across the shunt 128, to minimize headroom. The current feedback signal generally requires amplification (by the differential circuit 130 or the summers 118 and 120) to boost the small voltage across the shunt 128 and allow one-for-one comparison with the outputs of the DACs 112 and 114. No such amplification is needed for the voltage-controlled loop. In fact, to achieve high output voltages the feedback must be attenuated. These conflicting requirements generally lead to a situation in which one sacrificially slows the voltage-controlled loop to keep the current-controlled loops stable.

The instant invention avoids this sacrifice by allowing separate input resistors to be used in the different modes to drive the control circuit's integrator. Referring to FIG. 4, the crossover circuit 400 includes a first input resistor 418 for voltage-controlled mode, and a second input resistor 420 for the current-controlled modes. If desired, different input resistors can be provided for each of the two current-controlled modes. The input resistors can be accompanied by additional components coupled in series or in parallel with the input resistors, for establishing various compensating effects. The instant invention thus allows different dominant frequency characteristics to be established for different loops. The different loops can then be individually optimized for stability and response time.

Alternatives

Figure 8:
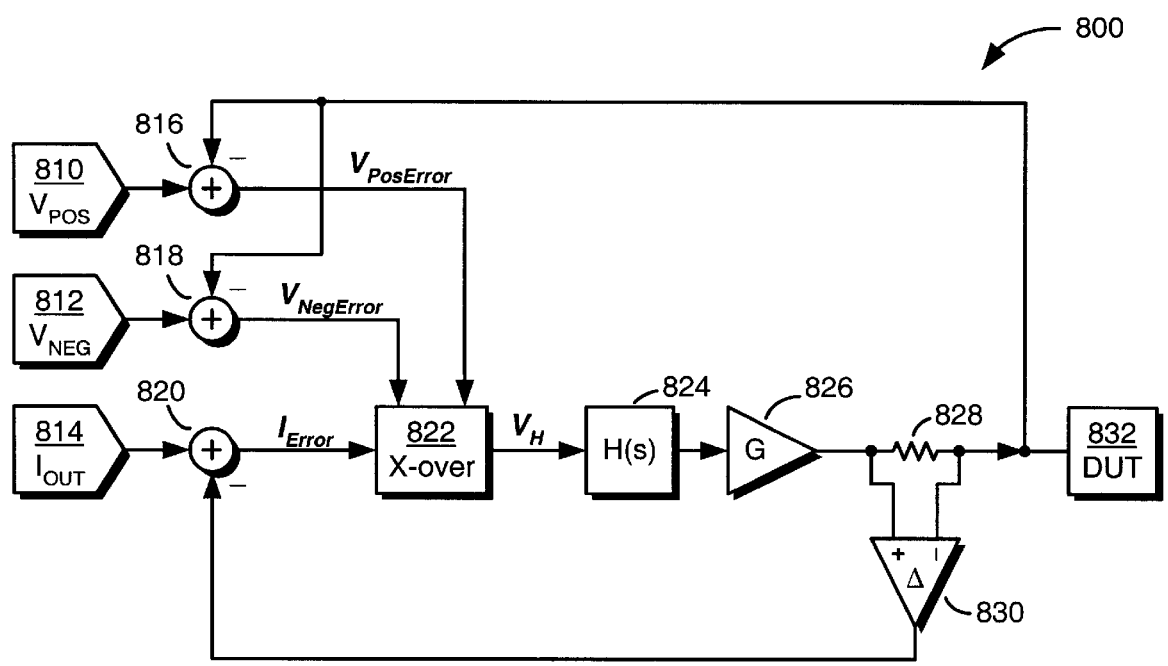
FIG. 8 is a block diagram of an alternative electronic source with which the crossover circuit of FIG. 4 can be used according to an alternative embodiment of the invention, which provides operation in two current-controlled modes and one voltage-controlled mode.
Figure 9:
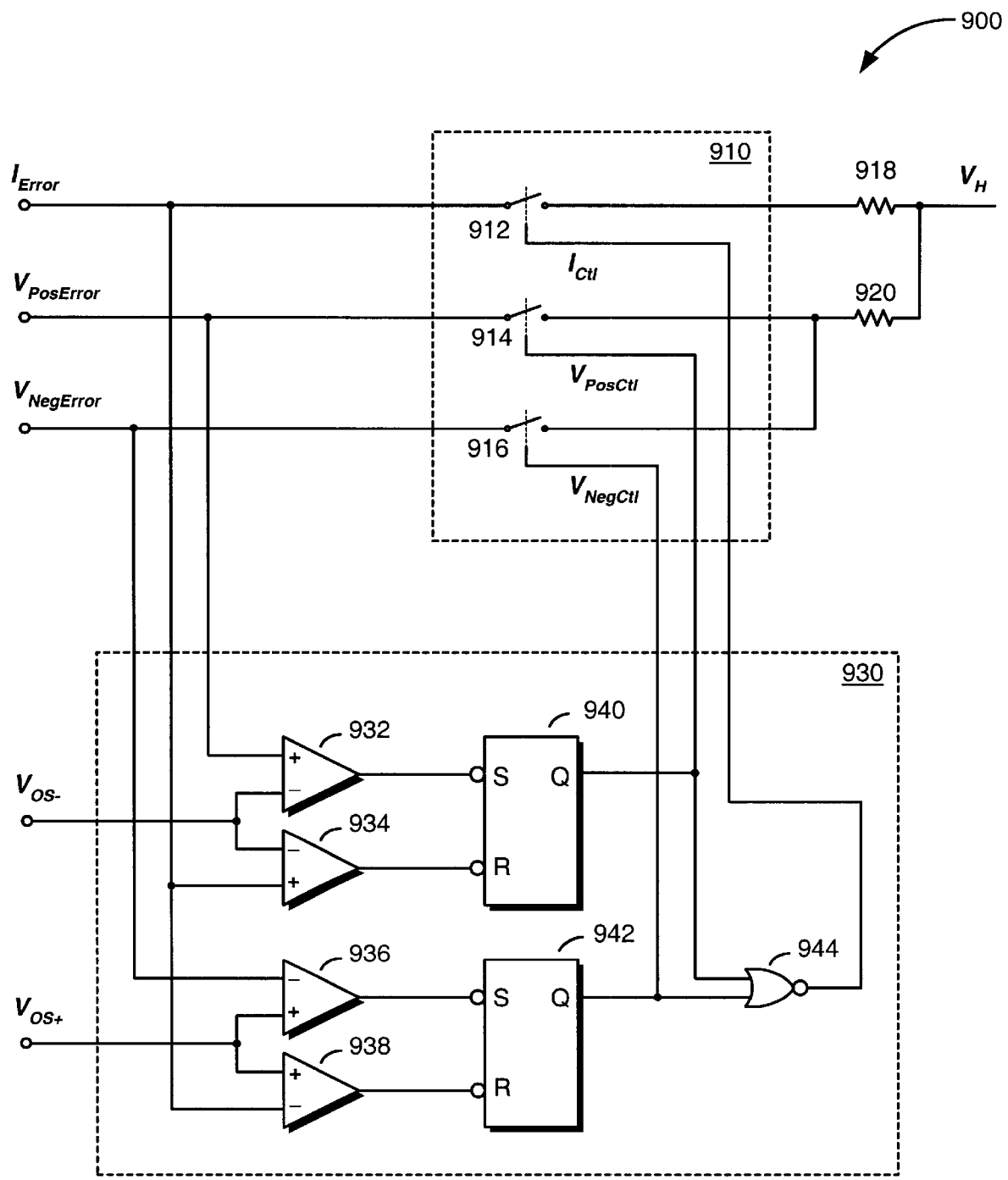
FIG. 9 is a simplified schematic of the crossover circuit of FIG. 4 adapted for use with the alternative electronic source of FIG. 8.

Having described one embodiment, numerous alternative embodiments or variations can be made. The description has focused primarily on using the crossover circuit 400 in a V/I circuit with one voltage-controlled loop and two current-controlled loops. However, the crossover circuit 400 can alternatively be used in a V/I circuit with one current-controlled loop and two voltage-controlled loops, as shown in FIGS. 8 and 9. With this arrangement, the V/I source can be regarded as a current source with positive and negative voltage clamps.

As described above, the crossover circuit 400 selects from among three error signals, for controlling three different feedback loops. It can also be used, however, to switch between two error signals, for controlling only two feedback loops. According to this embodiment, one pair of comparators and a latch of FIG. 4 can be omitted. The remaining S/R latch selects one error signal from its Q output, and the other error signal from a complement of its Q output.

The techniques described above are applicable to areas other than V/I sources used in automatic test equipment. In many control systems, voltage and current are used to represent a variety of physical characteristics. The crossover circuit 400 and associated methods described herein are applicable to those systems as well, to select among different feedback modes that are represented with voltages and currents.

As described above, the output current(s) and voltage(s) are programmable. However, this is merely an example. Any of these outputs can be fixed rather than programmable. In addition, separate DACs 112 and 114 are described for providing positive and negative programmable currents. Alternatively, one DAC could be used for one polarity, with an electronic inverter driven from the same DAC to provide the other polarity. Using an analogous arrangement, one DAC could be used to provide both voltage clamps for the embodiment of FIGS. 8 and 9.

As described above, one threshold voltage $V_{OS-}$ is supplied to comparators 432 and 434, and another threshold voltage $V_{OS+}$ is supplied to comparators 436 and 438. Alternatively, each comparator could receive a different threshold voltage, optimized for the particular transition that the respective comparator detects. Moreover, the thresholds could be variable instead of fixed, to allow them to be varied based upon output or load conditions. As described above, the non-zero nature of the threshold voltages affords the crossover circuit 400 a type of hysteresis. Feeding back a portion of a comparator output (or the output of an S/R latch) to an input of the respective comparator could also be used to provide hysteresis.

As with most electronic circuits, the particular topology of the crossover circuit 400 can be varied based upon known ways of transforming digital and analog circuits, to provide a circuit having a different appearance, but which accomplishes the same results.

Each of these alternatives and variations, as well as others, has been contemplated by the inventors and is intended to fall within the scope of the instant invention. It should be understood, therefore, that the foregoing description is by way of example, and the invention should be limited only by the spirit and scope of the appended claims.

What is claimed is:

1. In an electronic source having a control circuit and a plurality of feedback modes that includes a voltage-controlled mode and a current-controlled mode, a crossover circuit for establishing the feedback mode of the electronic source, comprising:

a selector having a plurality of inputs for receiving a plurality of signals indicative of at least one feedback voltage and at least one feedback current of the electronic source, and an output for selectively providing one of the plurality of signals to the control circuit; and a digital logic circuit receiving the plurality of signals and having an output coupled to the selector for providing at least one control signal that varies in response to occurrences of predetermined events of the plurality of signals.

2. A crossover circuit as recited in claim 1, wherein the digital logic circuit comprises a comparator circuit having a plurality of inputs for receiving the plurality of signals and at least one output that varies in response to said occurrences of predetermined events of the plurality of signals.

3. A crossover circuit as recited in claim 2, wherein the comparator circuit comprises:

a first comparator having a first input receiving a first of the plurality of signals and a second input receiving a reference signal; and a second comparator having a first input receiving a second of the plurality of signals and a second input receiving the reference signal, the first and second comparators each having an output.

4. A crossover circuit as recited in claim 3, wherein the reference signal is a first reference signal and the comparator circuit further comprises:

a third comparator having a first input receiving the first of the plurality of signals and a second input receiving a second reference signal; and a fourth comparator having a first input receiving a third of the plurality of signals and a second input receiving the second reference signal, the third and fourth comparators each having an output.

5. A crossover circuit as recited in claim 3, wherein the digital logic circuit further comprises a latch having first and second inputs respectively coupled to the outputs of the first and second comparators, and an output coupled to the selector for selecting said one of the plurality of signals.

6. A crossover circuit as recited in claim 5, wherein the latch comprises a SET/RESET latch having a SET input coupled to the output of one of the first and second comparators and a RESET input coupled to the output of the other of the first and second comparators.

7. A crossover circuit as recited in claim 4, wherein the digital logic circuit further comprises:

a first latch having first and second inputs respectively coupled to the outputs of the first and second comparators, and an output coupled to the selector for selecting said one of the plurality of signals;

a second latch having first and second inputs respectively coupled to the outputs of the third and fourth comparators, and an output coupled to the selector for selecting said one of the plurality of signals; and a logic gate having first and second inputs coupled to the outputs of the first and second latches, and an output coupled to the selector for selecting said one of the plurality of signals.

8. A crossover circuit as recited in claim 1, wherein the plurality of signals are error signals each corresponding to a difference between a prescribed value and an actual value.

9. A crossover circuit as recited in claim 8, wherein the plurality of signals comprise a voltage error, a first current error, and a second current error.

10. A crossover circuit as recited in claim 9, wherein the first current error is a positive current error and the second current error is a negative current error.

11. A crossover circuit as recited in claim 8, wherein the plurality of signals comprise a current error, a first voltage error, and a second voltage error.

12. A crossover circuit as recited in claim 11, wherein the first voltage error is a positive voltage error and the second voltage error is a negative voltage error.

13. A crossover circuit as recited in claim 1, wherein the selector includes a first impedance coupled in series with the control circuit responsive to one of the plurality of signals being selected, and a second impedance coupled in series with the control circuit responsive to another of the plurality of signals being selected.

14. A crossover circuit as recited in claim 13, wherein the first and second impedances operate in conjunction with the control circuit for establishing different frequency response characteristics of the electronic source.

15. An electronic source providing a plurality of feedback modes including at least one voltage-controlled mode and at least one current-controlled mode, comprising:

a first summing circuit having an output that provides a voltage error signal;

a second summing circuit having an output that provides a current error signal;

a control circuit having an input receiving one of the voltage error signal and the current error signal and having an output coupled to the output of the electronic source; and a crossover circuit including a selector having a first input for receiving the voltage error signal, a second input for receiving the current error signal, and an output for selectively providing one of the voltage error signal and current error signal to the input of the control circuit; and a digital logic circuit having a first input for receiving the voltage error signal, a second input for receiving the current error signal, and an output coupled to the selector for selecting said one of the voltage and current error signals in response to predetermined events occurring on the voltage and current error signals.

16. A crossover circuit for establishing the feedback mode of an electronic source, the electronic source having a control circuit and a plurality of feedback modes that includes a voltage-controlled mode and a current-controlled mode, the crossover circuit comprising:

a selector having a plurality of inputs for receiving a plurality of signals indicative of at least one feedback voltage and at least one feedback current of the electronic source, and an output for selectively providing one of the plurality of signals to the control circuit; and a measurement circuit receiving the plurality of signals and coupled to the selector for selecting said one of the plurality of signals in response to occurrences of predetermined events of the plurality of signals.

17. A crossover circuit as recited in claim 16, wherein the measurement circuit comprises a plurality of comparators having inputs for receiving the plurality of signals and generating a plurality of outputs that vary in response to said occurrences of predetermined events of the plurality of signals.

18. In an electronic source having a voltage-controlled mode and a current-controlled mode, a method of establishing the feedback mode of the electronic source, comprising:

activating the current-controlled mode responsive to a current error signal crossing a first threshold level; and activating the voltage-controlled mode responsive to a voltage error signal crossing at least one of the first threshold level and a second threshold level, wherein said at least one of the first threshold level and the second threshold level is substantially constant in response to variations in the voltage error signal.

19. A method as recited in claim 18, wherein the current error signal is obtained by comparing a signal indicative of an output current of the electronic source with a signal indicative of a prescribed current value; and the voltage error signal is obtained by comparing a signal indicative of an output voltage of the electronic source with a signal indicative of a prescribed voltage value.

20. A method as recited in claim 19, wherein at least one of the prescribed voltage value and the prescribed current value is a programmable value.

21. A method as recited in claim 19, wherein at least one of the prescribed voltage value and the prescribed current value is a fixed value.

22. A method as recited in claim 19, wherein the prescribed current value is a first prescribed current value and the current error signal is a first current error signal, the method further comprising:

comparing the signal indicative of the output current of the electronic source with a second prescribed current value, to produce a second current error signal;

activating the current-controlled mode responsive to the second current error signal crossing a third threshold level; and activating the voltage-controlled mode responsive to the voltage error signal crossing at least one of the third threshold level and a fourth threshold level.

23. A method as recited in claim 19, wherein the prescribed voltage value is a first prescribed voltage value and the voltage error signal is a first voltage error signal, the method further comprising:

comparing the signal indicative of the output voltage of the electronic source with a second prescribed voltage value, to produce a second voltage error signal;

activating the current-controlled mode responsive to the current error signal crossing a third threshold level; and activating the voltage-controlled mode responsive to the second voltage error signal crossing at least one of the third threshold level and a fourth threshold level.

24. A method as recited in claim 18, wherein the first threshold level is a fixed voltage.

25. A method as recited in claim 18, wherein the first threshold level is variable based upon whether the electronic source assumes a voltage-controlled mode or a current-controlled mode, for establishing a hysteresis band for mode transitions.

26. A method as recited in claim 18, wherein the step of activating the current-controlled mode includes providing a first impedance in series with a control circuit for establishing first frequency response characteristics of the electronic source, and wherein the step of activating the voltage-controlled mode includes providing a second impedance in series with the control circuit for establishing second frequency response characteristics of the electronic source.

* * * * *